United States Patent
Rudeck et al.

(10) Patent No.: US 6,297,092 B1
(45) Date of Patent: Oct. 2, 2001

(54) METHOD AND STRUCTURE FOR AN OXIDE LAYER OVERLAYING AN OXIDATION-RESISTANT LAYER

(75) Inventors: Paul J. Rudeck; Kelly T. Hurley, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/205,140

(22) Filed: Dec. 2, 1998

(51) Int. Cl.$^7$ .................................................. H01L 21/336
(52) U.S. Cl. ........................ 438/257; 438/657; 438/636
(58) Field of Search .................................. 438/257, 671, 438/669, 657, 636, 791, 792, 261–267

(56) References Cited

U.S. PATENT DOCUMENTS

| | | |
|---|---|---|
| 5,378,659 | * 1/1995 | Roman et al. . |
| 5,656,837 | 8/1997 | Lancaster et al. ............... 257/314 |
| 5,781,031 | 7/1998 | Bertin et al. ....................... 326/39 |
| 5,985,771 | * 11/1999 | Moore et al. ...................... 438/791 |
| 6,051,511 | * 11/1999 | Thakur et al. ..................... 438/791 |
| 6,069,640 | * 8/2000 | Hu .................................... 438/652 |
| 6,177,311 | * 1/2001 | Kauffman et al. . |

* cited by examiner

Primary Examiner—Caridad Everhart

(57) ABSTRACT

A method used during the formation of a semiconductor device such as a flash memory device comprises the steps of forming a floating gate layer over a semiconductor wafer substrate then forming a first oxide layer over the floating gate layer. An oxidation-resistant layer such as a nitride layer is formed over the first oxide layer wherein a first portion of the oxidation-resistant layer oxidizes more readily than a second portion of the oxidation-resistant layer. To accomplish this the first portion of the oxidation-resistant layer can be formed to have a higher silicon concentration than the second portion. The first portion of the oxidation-resistant layer is oxidized to form a second oxide layer and a control gate layer is formed over the second oxide layer. An in-process semiconductor device is also described.

23 Claims, 2 Drawing Sheets

METHOD AND STRUCTURE FOR AN OXIDE LAYER OVERLAYING AN OXIDATION-RESISTANT LAYER

FIELD OF THE INVENTION

The invention relates generally to the field of nonvolatile semiconductor memories, and more specifically to the field of floating gate programmable memories.

BACKGROUND OF THE INVENTION

Floating gate memory devices such as flash memories include an array of electrically programmable and electrically erasable memory cells. Typically, each memory cell comprises a single n-channel metal oxide semiconductor (NMOS) transistor, including a floating gate interposed between a control (input) gate and a channel. A layer of high-quality tunnel oxide used as gate oxide separates the transistor channel and the floating gate, and an oxide-nitride-oxide (ONO) dielectric stack separates the floating gate from the control gate. The ONO stack typically comprises a layer of silicon nitride ($Si_3N_4$) interposed between an underlying layer and an overlying layer of silicon dioxide ($SiO_2$). The underlying layer of $SiO_2$ is typically grown on the first doped polycrystalline silicon (poly) layer. The nitride layer is deposited over the underlying oxide layer, and the overlying oxide layer can be either grown or deposited on the nitride layer. The ONO layer maximizes the capacitive coupling between the floating gate and the control gate and minimizes the leakage of current through the film.

In order to program a flash cell the drain region and the control gate are raised to predetermined potentials above a potential applied to the source region. For example 12 volts are applied to the control gate, 0.0 volts are applied to the source, and 6.0 volts are applied to the drain. These voltages produce "hot electrons" which are accelerated from the substrate across the gate oxide layer to the floating gate. To erase a flash cell a high positive potential, for example 12 volts, is applied to the source region, the control gate is grounded, and the drain is allowed to float. These voltages are applied for a timed period, and the longer the period the more the cell becomes erased. A strong electric field develops between the floating gate and the source region, and negative charge is extracted from the floating gate across the tunnel oxide to the source region, for example by Fowler-Nordheim tunneling.

The bottom and top silicon dioxide layers in the ONO stack with current technology are typically about 40Å thick and the silicon nitride layer is typically about 100Å thick. This silicon dioxide layer passivates any pinhole defects in the nitride, which are common with nitride layers. Oxidizing the nitride layer to form the overlying silicon dioxide layer has improved pinhole passivation over deposited oxide layers. Further, the thickness of the top silicon dioxide layer is easier to control when grown rather than deposited. However, because the Si—N bond is very stable and silicon nitride has a low availability of unreacted silicon, it is difficult and time consuming to oxidize nitride at lower temperatures. Thus the nitride oxidation process is typically performed at relatively high temperatures for example at 950° C. or higher. If the oxidation temperature is lowered to 900° C. or below, it will require at least 120 minutes to form a 40Å film.

Increased processing temperatures, such as those for growing silicon dioxide on nitride, are known to cause various problems in the field of semiconductor device manufacturing, and failures related to flash memory devices in particular. For example, increased temperatures are known to stress the interfaces of previously grown films such as the tunnel oxide and field oxide. These films then become more prone to charge trapping, which degrades the operation of the device.

A method for forming a semiconductor device, particularly a flash memory device, which allows for the improved formation of a silicon dioxide layer over a layer which resists oxide formation, such as a nitride layer in an ONO stack, would be desirable.

SUMMARY OF THE INVENTION

The present invention provides a new method for forming an interlayer dielectric, for example an oxide-nitride-oxide (ONO) layer between a floating gate layer and a control gate layer, which allows for the growth of an oxide layer over a nitride layer at decreased temperatures compared with conventional processes. In accordance with one embodiment of the invention a first oxide layer is grown or deposited over a floating gate poly layer, then a nitride layer is formed over the first oxide layer. During the nitride formation, at least an upper portion of the nitride layer is siliconized. Finally, a second oxide layer is grown over the nitride layer. The siliconized (silicon-rich) nitride layer enhances the formation of the second oxide layer and allows for its growth at lower temperatures than conventional processes. Growing the second oxide layer rather than depositing the second oxide layer provides improved healing of pinhole defects in the nitride layer. Growing the second oxide layer at lower temperatures than can be done with conventional processing reduces problems associated with a tunnel oxide layer of a flash memory device and reduces other temperature-induced failures.

In a second embodiment a pure silicon layer, such as a thin polycrystalline silicon layer is formed over a nitride layer in the ONO stack. The polycrystalline silicon layer is more easily oxidized than the nitride layer, thereby decreasing processing time.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
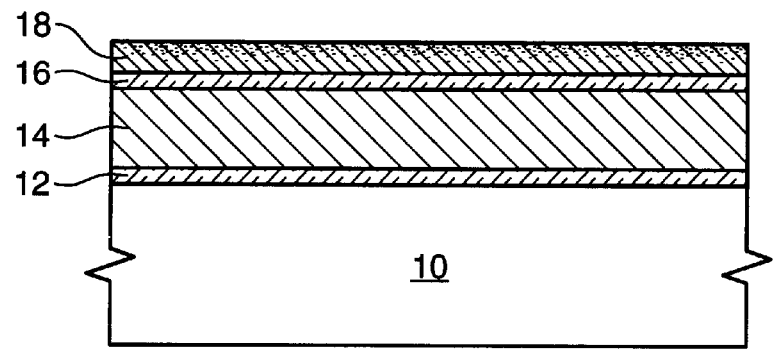
FIGS. 1–3 are cross sections of a first embodiment of the invention using a concentration of oxidation-enhancing material such as silicon within a oxidation-resistant layer such as nitride.

FIG. 1 depicts a memory structure comprising a semiconductor wafer substrate assembly comprising a semiconductor wafer 10, a gate oxide layer such as a tunnel oxide layer 12, and a first polycrystalline silicon (poly) layer which forms, for example, a flash transistor floating gate 14. FIG. 1 further comprises an oxide layer 16 and a silicon nitride layer 18 which form a portion of an oxide-nitride-oxide (ONO) layer.

The instant embodiment of the invention relates to the formation of the ONO layer. The gate oxide 12, floating gate poly layer 14 and first oxide layer 16 of an ONO stack are formed according to means known in the art. Poly layer 14, for example, is partially oxidized to form a first layer of silicon dioxide dielectric of from about 30Å thick to about 45Å thick over the floating gate poly layer 14.

Next, a blanket silicon nitride layer 18 is deposited on the first silicon dioxide layer 16. Silicon nitride layers are known in the art to resist oxidation, and thus high-temperature processing is conventionally required to oxidize the layer. To provide a nitride layer which is more readily oxidized at lower temperatures, at least an upper portion of the nitride is siliconized such that it comprises a concentration of silicon atoms greater than a lower portion of the nitride. Thus a conventional first lower portion of the nitride layer can be formed in combination with a second upper portion which is silicon-rich. The lower portion resists oxidation so that the nitride layer is not over-oxidized and is self-limiting. This allows the desirable electrical properties of nitride to be maintained, while the upper portion is more readily oxidized due to the concentration of silicon atoms.

To form the silicon nitride layer having a low concentration of silicon in a lower portion and a higher concentration of silicon in an upper portion, the wafer substrate assembly having oxide layer 16 is placed in (or remains from the prior process in) a low pressure chemical vapor deposition (LPCVD) furnace at a temperature of between about 400° C. and about 800° C., for example about 720° C. Silane gas ($SiH_4$) or dichlorosilane gas (DCS, $SiCl_2H_2$) and ammonia gas ($NH_3$) are introduced into the chamber. A DCS flow rate is between about 20 sccm and about 100 sccm, for example about 30 sccm, and the ammonia flow rate is between about 150 sccm and 300 sccm, for example about 180 sccm. If silane is used, the values listed herein for DCS can be modified by one of ordinary skill in the art for silane. After about 20 minutes the flow of the ammonia is reduced and/or the flow rate of the DCS is increased which results in the availability of more silicon atoms for incorporation into the nitride. The flow rate to which the ammonia gas is reduced or the rate at which the DCS is increased is a function of initial flow and the required oxidation properties of the siliconized nitride film. Generally, a reduced ammonia flow rate of between about 10 sccm and about 30 sccm and/or an increased DCS flow rate of between about 30 sccm and about 110 sccm would be sufficient. The chemical formula for the siliconized nitride layer will be $Si_xN_4$, where $x>3$. The change of the ammonia and/or DCS flow rates can be performed over an extended period of time to provide a graduated silicon concentration. A more rapid change, for example with an instant change over one second or less would provide a more abrupt silicon concentration change. For this process, a nitride layer 100Å would be formed. The structure having a siliconized nitride layer 18 is depicted in FIG. 1.

It should be noted that the lower portion of the silicon nitride layer is predominantly $Si_3N_4$ although other molecules may exist. Further, while the formula of the siliconized nitride is predominantly $Si_xN_4$ where $x>3$ and is denoted as such herein, some $Si_3N_4$ or other molecules may be incorporated into the film.

Figure 2:
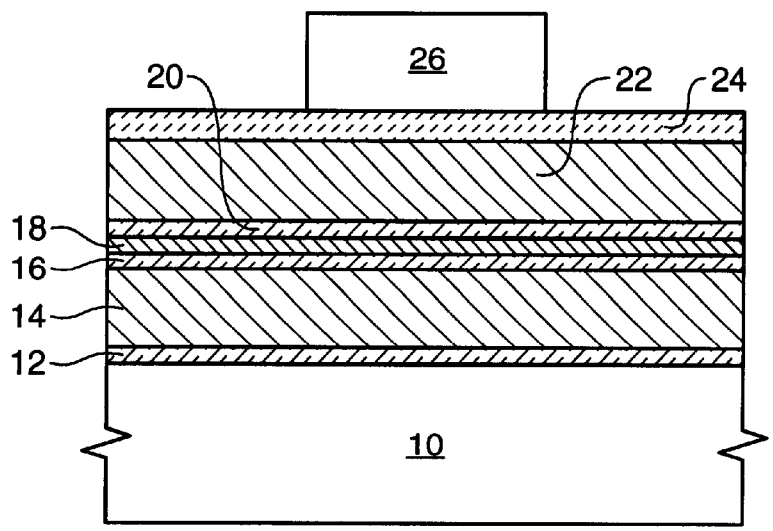
Figure 3:
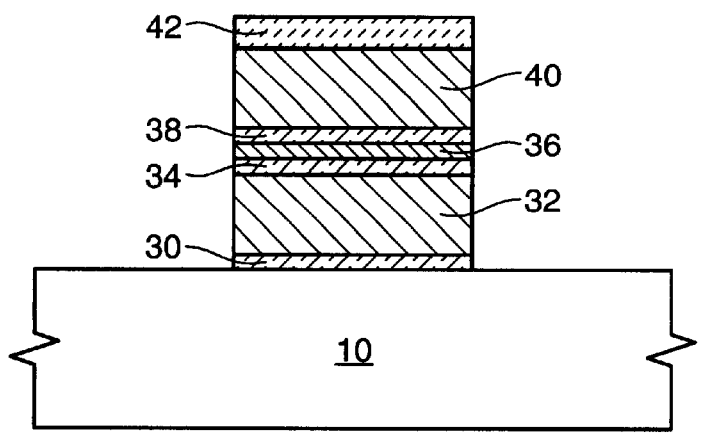

Next, the siliconized nitride is oxidized to form the upper oxide layer 20 in the ONO stack from about 10Å to about 40Å thick as depicted in FIG. 2. The wafer assembly substrate is placed into an oxidation furnace (atmospheric furnace). The nitride is subjected to a temperature of between about 750° C. and about 900° C. (for example 900° C.) for between about five minutes and about 90 minutes (for example 30 minutes) in a dry oxidizing atmosphere of oxygen or a wet oxidizing atmosphere of oxygen and hydrogen. For a wet oxidation, $H_2$ and $O_2$ flow rates of between about 1.0 standard liters/min (SLM) to about 10 SLM would be sufficient. The temperatures of this step are much less than the temperatures normally required to oxidize a nitride layer, which are typically in the range of from 950° C. to 1050° C. Wafer processing then continues according to means known in the art, for example to form the control gate poly layer 22 over the ONO stack, additional oxide layers 24 over the control gate poly 22 then masking 26 and etching the two layers of poly and the ONO stack to pattern the structure. FIG. 3 depicts the patterned gate oxide 30, floating gate 32, lower oxide 34 of the ONO layer, nitride 36 of the ONO layer, upper oxide 38 of the ONO layer, control gate 40, and an oxide layer 42 overlying the control gate 40.

Figure 4:
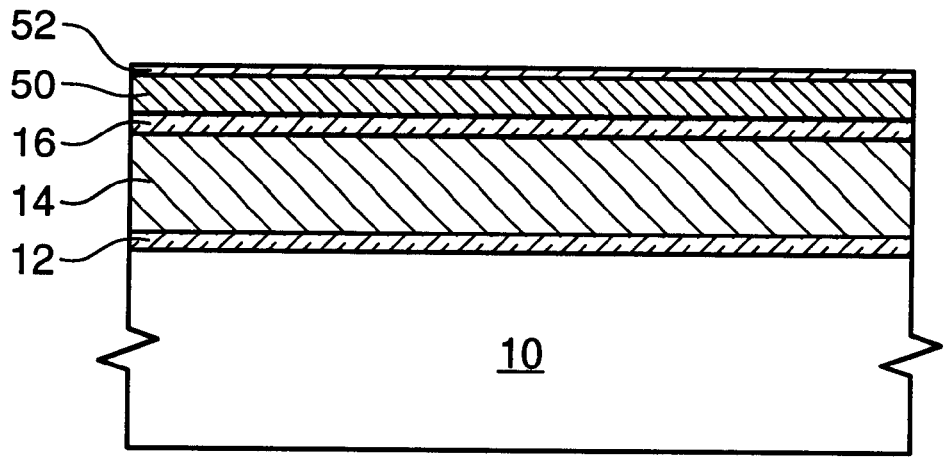
FIGS. 4–5 are cross sections of a second embodiment of the invention using a thin layer which is readily oxidized, such as polycrystalline silicon, over a nitride layer to form an oxide-nitride-oxide layer between a floating gate and a control gate.

Another embodiment of the invention includes forming the tunnel oxide 12 over a semiconductor wafer 10, forming the floating gate poly layer 14, and forming the first oxide layer 16 and a nitride layer 50 of the ONO stack as depicted in FIG. 4. These layers can be conventionally formed. Subsequently, a thin blanket layer of poly or amorphous silicon 52 is formed on the nitride layer. A poly or amorphous silicon layer can be deposited over the nitride in an LPCVD furnace at a temperature of between about 500° C. and about 700° C., for example 620° C., typically using silane gas as a source. The process continues for between about 30 seconds to about 150 seconds to form a poly layer between about 5Å thick to about 25Å thick, for example about 20Å thick.

Figure 5:
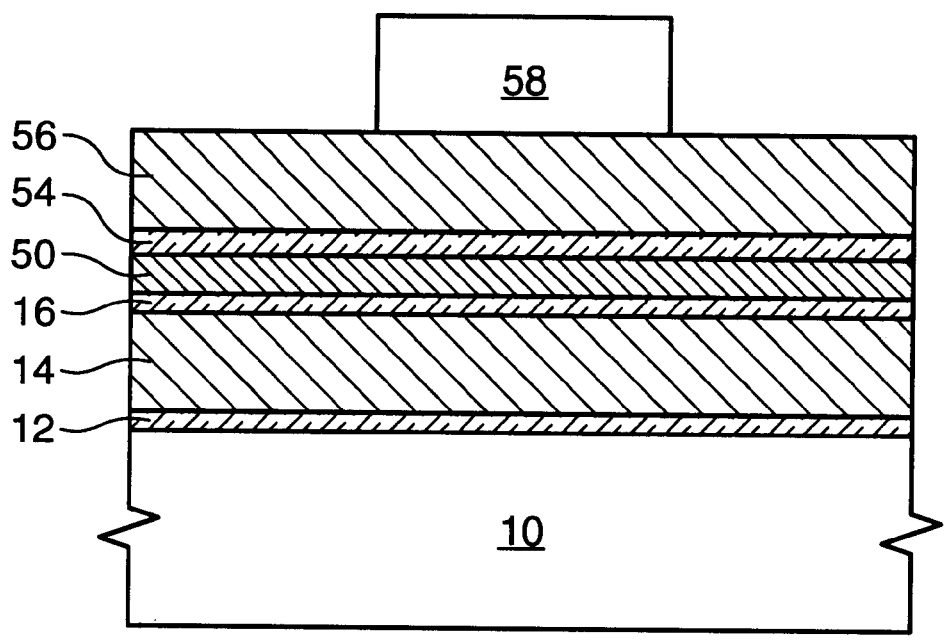

After the poly or amorphous silicon layer is formed over the nitride layer the poly is oxidized, for example in a diffusion furnace to form the top oxide layer 54 of the ONO stack as depicted in FIG. 5. For a dry oxidation, the structure is elevated to a temperature of between about 750° C. and about 900° C., for example 900° C. in the presence of $O_2$ gas having a flow rate of between about 2.0 SLM and about 10.5 SLM, for example about 9 SLM for between about 5 minutes and 15 minutes. For a wet oxidation, the layer is exposed to $O_2$ and $H_2$ gas. Beginning with a poly layer having a thickness of between about 5Å and about 25Å thick results in a top oxide layer from about 10Å to about 60Å thick. Preferably, the thin poly layer 52 overlying the nitride 50 in FIG. 4 is completely oxidized to form layer 54 of FIG. 5 so that subsequent processing steps are not adversely affected by any unoxidized poly. Wafer processing then continues according to means known in the art, for example to form the control gate poly layer 56 over the ONO stack 16, 52, 54, masking 58 then etching layers 12–56 of FIG. 5 to pattern the floating gate, the control gate, and the ONO stack.

An advantage of the silicon-rich nitride layer portion is that the growth of the second oxide layer over the nitride layer is self-limiting. As the silicon concentration decreases deeper into the nitride layer the oxidation rate decreases and oxide formation slows. Thus the thickness of the second oxide layer overlying the nitride may be more controllable than a deposited oxide layer or an oxide layer which is grown on a conventional nitride layer. Further, forming the ONO layer at decreased temperatures over conventional processes improves the charge trapping properties of the tunnel oxide. Similarly, forming a poly layer over a nitride layer then oxidizing the poly has similar advantages over conventional processes as the poly is more readily oxidized at lower temperatures than is nitride. Further, oxidizing a poly layer overlying the nitride is also somewhat limiting as the poly oxidizes at a much faster rate than the nitride.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a transistor having two gates comprising the following steps:

forming a first transistor gate layer;

forming a siliconized nitride layer over said first transistor gate layer;

oxidizing said siliconized nitride layer to form an oxide layer;

forming a second transistor gate layer over said oxide layer; and subsequent to forming said second transistor gate layer, etching said first and second gate layers to define first and second transistor gates.

2. The method of claim 1 wherein said step of forming said siliconized nitride layer comprises the following steps:

forming a first nitride layer portion having a first silicon concentration and a second nitride layer portion having a second silicon concentration overlying said first portion, wherein said second concentration is higher than said first concentration.

3. The method of claim 1 wherein said step of forming said siliconized nitride layer forms a first nitride layer portion having a formula of $Si_3N_4$ and forms a second nitride layer portion having a formula of $Si_xN_4$ where x>3.

4. A method used during the formation of a semiconductor device comprising the following steps:

forming an oxidation-resistant layer comprising at least a first region having a first concentration of silicon atoms and a second region overlying said first region having a second concentration of silicon atoms, wherein said first concentration is less than said second region and;

oxidizing said second region and leaving said first region underlying said second region unoxidized.

5. The method of claim 4 further comprising the following steps:

prior to said step of forming said oxidation-resistant layer, forming a first polycrystalline silicon layer, then forming said oxidation-resistant layer over said first polycrystalline silicon layer and;

subsequent to said step of oxidizing said second region, forming a second polycrystalline silicon layer on said oxidized portion of said oxidation-resistant layer such that said oxidation-resistant layer is interposed between said first and second polycrystalline silicon layers.

6. A method used during the formation of a semiconductor device comprising the following steps:

forming a floating gate layer over a semiconductor wafer substrate;

forming a first oxide layer over and contacting said floating gate layer;

forming an oxidation-resistant layer over and contacting said first oxide layer wherein a first portion of said oxidation-resistant layer oxidizes more readily than a second portion of said oxidation-resistant layer;

oxidizing said first portion of said oxidation-resistant layer to form a second oxide layer; and forming a control gate over and contacting said second oxide layer.

7. The method of claim 6 wherein said step of forming said oxidation-resistant layer further comprises the steps of forming a first concentration of an oxidation-enhancing material in said first portion of said oxidation-resistant layer and a second concentration of said oxidation-enhancing material in said second portion of said oxidation-resistant layer wherein said first concentration is higher than said second concentration.

8. The method of claim 7 wherein said oxidation-enhancing material comprises silicon.

9. The method of claim 8 wherein said second portion of said oxidation-resistant layer has a formula of $Si_3N_4$ and said first portion of said oxidation-resistant layer has a formula of $Si_xN_4$ where x>3.

10. A method used during the formation of a semiconductor device comprising the following steps:

forming a conductive floating gate layer over a semiconductor wafer substrate;

forming an oxidation-resistant layer over said floating gate layer;

forming an oxidizable layer over said oxidation-resistant layer;

oxidizing said oxidizable layer;

forming a conductive control gate layer over said oxidizable layer; and etching said floating gate layer and said control gate layer to define a floating gate and a control gate with said oxidation-resistant layer and said oxidized oxidizable layer interposed therebetween.

11. The method of claim 10 further comprising the step of forming an oxide layer over said floating gate layer prior to said step of forming said oxidation-resistant layer wherein said floating gate layer contacts said oxide layer, said oxidation-resistant layer contacts said oxide layer, and said oxidizable layer contacts said oxidation-resistant layer.

12. The method of claim 10 wherein said step of forming said oxidizable layer forms an oxidizable layer from polycrystalline silicon.

13. The method of claim 10 wherein said step of forming said oxidizable layer forms an oxidizable layer from amorphous silicon.

14. A method used during the formation of a semiconductor device comprising the following steps:

providing a semiconductor wafer substrate assembly comprising a semiconductor wafer;

placing said wafer substrate assembly in a furnace;

providing a temperature of between about 400° C. and about 800° C. in said furnace;

introducing dichlorosilane gas and ammonia gas into said furnace to form a first silicon nitride layer portion having a first concentration of silicon;

subsequent to said step of introducing dichlorosilane gas and ammonia gas into said furnace, increasing a ratio of said dichlorosilane gas relative to said ammonia gas to form a second silicon nitride layer portion having a second concentration of silicon which is greater than said first concentration; and oxidizing said second silicon nitride layer portion and leaving said first silicon nitride layer portion unoxidized.

15. The method of claim 14 wherein said step of providing said temperature of between about 400° C. and about 800° C. provides a temperature of about 720° C.

16. The method of claim 14 wherein said step of introducing said dichlorosilane gas and said ammonia gas into said furnace comprises providing dichlorosilane gas at a flow rate of between about 20 sccm and about 100 sccm and ammonia gas at a flow rate of between about 150 sccm and about 300 sccm.

17. The method of claim 14 wherein said step of increasing said ratio of dichlorosilane gas relative to the amount of ammonia gas comprises at least one of the following steps:
   decreasing the flow rate of ammonia gas to a flow rate of between about 10 sccm and about 30 sccm; and
   increasing the flow rate of dichlorosilane gas to a flow rate of between about 30 sccm and about 110 sccm.

18. A method used during the formation of a semiconductor device comprising the following steps:
   providing a semiconductor wafer substrate assembly comprising a semiconductor wafer, a gate oxide layer over said wafer, and a floating gate layer over said gate oxide layer;
   placing said wafer substrate assembly into a chamber;
   increasing a temperature within said chamber to between about 400° C. and about 800° C.;
   introducing a silicon-containing gas into said chamber at a flow rate of between about 20 sccm and about 100 sccm for about 20 minutes while introducing ammonia into said chamber at a flow rate of between about 150 sccm and about 300 sccm for about 20 minutes and exposing said wafer substrate assembly to said dichlorosilane gas and said ammonia gas;
   subsequent to said step of introducing said silicon-containing gas and said ammonia into said chamber for about 20 minutes, increasing a ratio of said silicon-containing gas relative to said ammonia gas, thereby forming a siliconized nitride layer on said wafer substrate assembly; and
   oxidizing a first portion of said siliconized nitride layer while leaving a second portion of said siliconized nitride layer unoxidized.

19. The method of claim 18 further comprising the following steps:
   placing said wafer substrate assembly into a low pressure chemical deposition chamber during said step of placing said wafer substrate assembly into a chamber;
   during said step of increasing said temperature within said chamber, increasing said temperature to about 720° C.;
   providing a dichlorosilane gas flow rate of about 30 sccm during said step of introducing said silicon-containing gas;
   providing an ammonia gas flow rate of about 180 sccm during said step of introducing said ammonia gas into said chamber; and
   during said step of oxidizing said first portion of said siliconized nitride layer, subjecting said nitride layer to a temperature of between about 750° C. and about 900° C. for between about five minutes and about 90 minutes.

20. A method used during the formation of a semiconductor device comprising:
   forming a first transistor gate layer;
   forming a siliconized nitride layer having a first portion with a first silicon concentration and a second portion with a second silicon concentration higher than said first concentration overlying said first portion;
   oxidizing said second portion of said siliconized nitride layer to forming an oxide layer;
   forming a second transistor gate layer over and contacting said oxidized second portion; and
   etching said first and second transistor gate layers to form first and second transistor gates.

21. The method of claim 20 wherein said oxide layer is a first oxide layer and said method further comprises:
   forming a second oxide layer over said first transistor gate layer prior to forming said siliconized nitride layer; and
   forming said siliconized nitride layer to contact said second oxide layer.

22. A method for forming a transistor having two gates comprising the following steps:
   forming a first transistor gate layer;
   forming a siliconized nitride layer over said first transistor gate layer, said siliconized nitride layer comprising a first siliconized nitride layer portion having a first silicon concentration and a second siliconized nitride layer portion having a second silicon concentration overlying said first portion, wherein said second concentration is higher than said first concentration;
   oxidizing said siliconized nitride layer to form an oxide layer; and
   forming a second transistor gate layer over said oxide layer.

23. The method of claim 22 wherein said step of forming said siliconized nitride layer forms a first nitride layer portion having a formula of $Si_3N_4$ and forms a second nitride layer portion having a formula of $Si_xN_4$ where x>3.

* * * * *